United States Patent [19]

Pasch et al.

[11] Patent Number: 5,217,566
[45] Date of Patent: Jun. 8, 1993

[54] DENSIFYING AND POLISHING GLASS LAYERS

[75] Inventors: Nicholas F. Pasch, Pacifica; Roger Patrick, Santa Clara, both of Calif.

[73] Assignee: LSI Logic Corporation, Milpitas, Calif.

[21] Appl. No.: 750,196

[22] Filed: Aug. 26, 1991

Related U.S. Application Data

[63] Continuation-in-part of Ser. No. 711,624, Jun. 6, 1991, and a continuation-in-part of Ser. No. 748,853, Aug. 22, 1991.

[51] Int. Cl.$^5$ .............................................. H01L 21/00
[52] U.S. Cl. ............................... 156/636; 156/645; 156/657; 156/663; 437/228; 437/247; 437/974
[58] Field of Search ............... 156/655, 645, 636, 663, 156/657; 427/96, 99, 397.7; 437/974, 228, 247

[56] References Cited

U.S. PATENT DOCUMENTS

| 4,019,248 | 4/1977 | Black | 29/583 |
|---|---|---|---|
| 4,490,209 | 12/1984 | Hartman | 156/643 |
| 4,493,142 | 1/1985 | Hwang | 29/575 |
| 4,609,809 | 9/1986 | Yamaguchi et al. | 219/121 |
| 4,758,306 | 7/1988 | Cronin et al. | 156/645 |
| 4,851,097 | 7/1989 | Hattori et al. | 204/192.33 |
| 4,980,019 | 12/1990 | Baerg et al. | 156/643 |
| 5,091,289 | 2/1992 | Cronin et al. | 430/312 |
| 5,091,330 | 2/1992 | Cambon et al. | 437/62 |
| 5,102,822 | 4/1992 | Calligaro | 437/67 |
| 5,104,482 | 4/1992 | Monkowski et al. | 156/643 |
| 5,142,828 | 9/1992 | Carry, II | 51/281 R |

FOREIGN PATENT DOCUMENTS 60-260455  11/1987  Japan ..................... 21/302

OTHER PUBLICATIONS

Thin Film Process, by Vossen et al., pp. 497–521, 1978.

*Primary Examiner*—Thi Dang
*Attorney, Agent, or Firm*—Gerald E. Linden; Michael D. Rostoker

[57] ABSTRACT

A glass passivation layer is deposited, densified and polished. Thereby an underlying wafer containing substantially defined devices is exposed to a temperature cycle that is sufficient for densification of the glass, and no more. Reflow and its attendant additional temperature cycle are thereby avoided, allowing for smaller, faster devices to be fabricated. Increased control over the ultimate thickness of the glass layer is also provided.

5 Claims, 1 Drawing Sheet

DENSIFYING AND POLISHING GLASS LAYERS

CROSS-REFERENCE TO RELATED APPLICATIONS

This application is a continuation-in-part of commonly-owned, copending U.S. patent application Ser. No. 07/711,624, entitled TRENCH PLANARIZATION TECHNIQUES and filed on Jun. 6, 1991 by Schoenborn and Pasch, and of commonly-owned, copending U.S. patent application Ser No. 07/748,853, entitled LATE ISOLATION WITH POLISHING and filed on Aug. 22, 1991 by Pasch.

1. Technical Field of the Invention

The present invention relates to semiconductor fabrication techniques and, more particularly to the application of an interlayer glass dielectric layer.

2. Background of the Invention

Phosphosilicate and boron-phosphosilicate glasses ("PSG" and "BPSG", respectively) are used as interlayer dielectrics in integrated device fabrication, and may be used at several steps in the process. Notably, these glasses are commonly used after the underlying silicon has been treated (doped, etched, etc.) to substantially define active semiconductor devices (e.g., transistors). In some cases, the glasses are deposited. In other cases they are formed as spin-on glass (SOG) layers. The present invention relates particularly to deposited glass layers.

As noted in commonly-owned U.S. Pat. No. 4,708,770, entitled PLANARIZED PROCESS FOR FORMING VIAS IN SILICON WAFERS, issued to Pasch and incorporated by reference herein, a boron-phosphorous glass (BPSG) layer may be deposited on a semiconductive silicon substrate or wafer at a relatively high temperature of 900°-1000° C. (degrees Celsius) so that the glass is liquified and flows to provide a glass layer of about 8000-10,000 Å having a relatively smooth surface. Given a sufficient thickness of glass, it can also flow to provide a relatively planar surface.

Typically, a sequence of thermal processes are involved in the formation of a deposited glass dielectric layer. In a first step, the glass layer is normally deposited at temperatures of about 700°-800° C.

Some high temperature treatment is also required to "densify" the glass, in order that it gains its full beneficial electrical characteristics as an insulator. The temperature for full "densification" of typical glasses is about 800° C.

In a subsequent step, the glass layer is heated to 900°-950° C. to effect reflow of the glass. The reflowed glass has a substantially smooth surface, which is desirable with respect to subsequently deposited layers. The temperature of the reflow step is determined by the composition of the glass, and there are compositions which will successfully reflow at temperatures of about 900° C. for a period of about 30 minutes. The glass layer so formed is typically a passivation layer and, as mentioned, there may be several glass layers in a completed device.

Such thermal treatment of the glass layer(s) comes, evidently, after the device has been substantially defined in the underlying silicon, and this can have an adverse impact on the temperature "budget" for the device. The temperature budget for wafer processing involves the use of high temperatures to develop electrical characteristics in silicon crystalline material and also to diffuse materials in characteristic and desirable ways within the crystal. The heat cycle involved in the reflow of the glass materials, coming as it does late in the process when the device has been substantially defined, is non-trivial. It is possible to develop undesirable device characteristics because of this additional high temperature step. Hence, the effects of subsequent temperature cycles must be accounted for in the design and layout of devices, and manifests itself most profoundly in the size (i.e., larger) and speed (i.e., slower) of the device.

These high temperature processes (deposition, densification and reflow) occur later in the process, i.e. after the introduction (implantation into the diffusion region) of atomic species (e.g., boron or phosphorous) which have high diffusion coefficients. The subsequent diffusion of these "fugitive" species at high temperatures, especially in the reflow cycle, has well known detrimental effects on the electrical characteristics of subsequently created active elements and structures, such as transistors. Among these detrimental effects is that subsequent diffusion (i.e., migration) of the fugitive species must be accounted for, which results in larger and slower active elements.

Another problem with extended thermal cycling of a glass layer is that glass layers thicker than a few (e.g., 3000) angstroms tend to crack, and this tendency is exacerbated by higher and more prolonged temperature cycles.

What is needed is a technique for applying glass layers in semiconductor devices at reduced temperatures.

In the main, hereinafter, the use of glass (PSG or BPSG) materials to smooth the surface of wafers which have their full isolation and polysilicon layers, but which lack contact and metal layers, is discussed, but the invention is applicable to glass layers formed at any stage in semiconductor fabrication.

DISCLOSURE OF THE INVENTION

It is therefore an object of the present invention to provide a lower temperature process for providing one or more glass layers in a semiconductor device.

It is a further object of the present invention to provide a technique for forming glass layers in semiconductor devices, without raising the wafer temperature above what is necessary for densification of the glass.

It is a further object of the present invention to provide a technique for applying a glass layer without degrading the electrical characteristics of the underlying substantially defined device(s).

It is a further object of the present invention to provide a technique for densifying and planarizing a glass layer, with reduced strain on the overall temperature budget. p It is a further object of the present invention to provide a technique for depositing glass layers over devices, while allowing for smaller and faster devices.

It is a further object of the present invention to provide a technique for creating thinner glass layers.

According to the invention, a glass layer is formed and densified on a semiconductor device, and is subsequently planarized by polishing, preferably chemi-mechanical polishing.

The use of polishing, rather than high temperature reflow, to planarize the glass layer allows for the elimination of an additional high temperature cycle that would otherwise be necessary to reflow the glass. The temperature cycle required to densify the glass is ordinarily lower than that required to reflow the glass.

Hence, with reduced temperature cycles required to apply ane densify a planarized (e.g., at least smooth) glass layer atop a substantially formed device, the fabrication of smaller and faster silicon devices is facilitated with no degradation of device characteristics.

The initial thickness of the glass layer depends on the topography of the underlying wafer, and the height and elevation of surface features covered by the glass. In any case, however, because the glass will be polished planar, rather than reflowed, the residual glass overlying the highest feature can be advantageously minimized.

Other objects, features and advantages of the invention will become apparent in light of the following description thereof.

The present invention, in its various embodiments, benefits from the quantitative and qualitative understandings of polishing, as described in the aforementioned U.S. patent application Ser. No. 07/711,624, entitled TRENCH PLANARIZATION TECHNIQUES and filed on Jun. 6, 1991 by Schoenborn and Pasch.

When polishing is referred to herein, it should be understood that it can be purely abrasive polishing, such as is disclosed in U.S. Pat. No. 4,940,507, but it preferably chemi-mechanical polishing as disclosed in U.S. Pat. Nos. 4,761,851, 4,910,155 and 4,944,836, all of which patents are incorporated by reference herein.

DETAILED DESCRIPTION OF THE INVENTION

Figure 1:
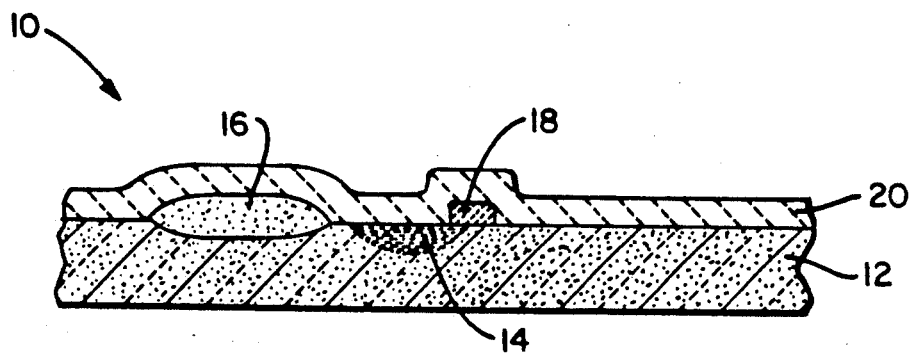
FIG. 1 is a cross-section of an idealized in-process semiconductor device, prior to application of a glass layer.

FIG. 1 shows an "idealized" semiconductor device 10. The device begins the fabrication process as a silicon wafer 12. Various diffusions 14, isolation structures 16, polysilicon structures 18 and the like may be formed in and upon the wafer 12, resulting in an irregular top surface topography. This is exemplary of what is referred to herein as a "substantially defined" semiconductor device. These features 14, 16 and 18 are typically covered by an isolation layer 20, such as silicon dioxide, which tends to be conformal to the topography of the underlying topography—in this case the topography resulting from the substantially defined active elements of the device. This is all generally known in the art to which the present invention most nearly pertains.

It is also known to planarize the isolation layer 20, and this is generally accomplished by applying a sacrificial planar layer (not shown) over the isolation layer and etching back the sacrificial layer and isolation layer with an etch recipe that etches these two layers at substantially the same rate.

As discussed above, it is also known to deposit, densify and reflow a glass passivation layer over the isolation layer 120, and to form subsequent contact and metal layers over the passivation layer.

According to the present invention, a layer of phosphosilicate glass (PSG) or boron-phosphosilicate glass (BPSG) is deposited onto a wafer, wherein devices have already been substantially defined.

Figure 2:
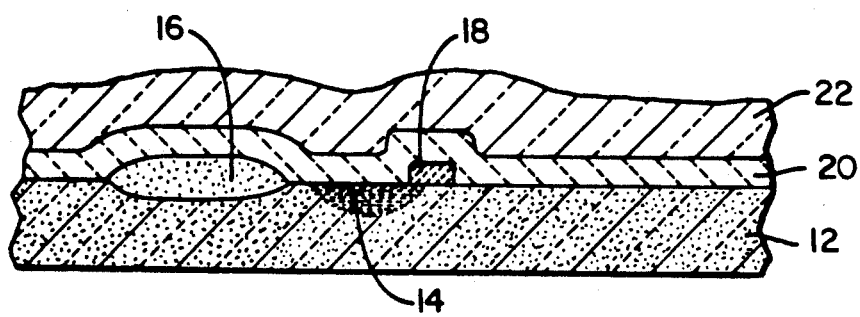
FIG. 2 is a cross-section of a semiconductor device having a glass passivation layer deposited thereon, according to the present invention.
Figure 3:
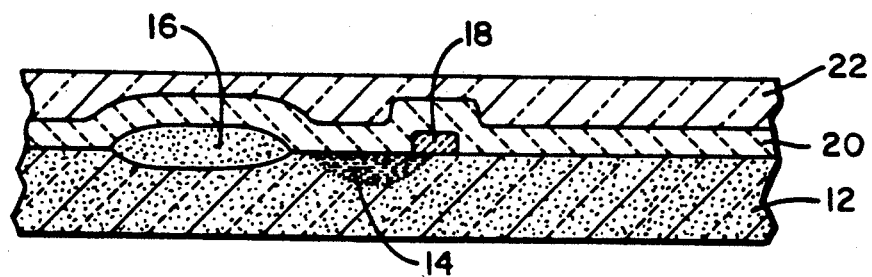
FIG. 3 is a cross-section of the semiconductor device of FIG. 2, after polishing, according to the present invention.

FIG. 2 shows such a device (as illustrated in FIG. 1) wherein a glass passivation layer 22 has been deposited over the wafer. Evidently, the thickness of the glass must be sufficient to cover the most protruding feature of the underlying surface. In the case of a planarized isolation layer underlying the passivation layer, the passivation layer does not need to be very thick.

According to the invention, the glass is deposited at an elevated temperature of about 700°–800° C.

Further according to the invention, the elevated temperature (700°–800° C.) is maintained (or increased, as the case may be) to approximately 800° +/− 50° C., but only sufficient to effect complete densification of the glass. The actual temperature and time required to effect densification will depend upon the particular glass material chosen, but is typically about 800° C.

As is evident from FIG. 2, the resulting glass passivation layer 22 is not smooth or planar. Rather, it is irregular and exhibits troughs or depressions in its surface In the prior art, it is known to subject the wafer to an additional temperature cycle, at an even higher temperature, to reflow the glass, which will smooth and tend to planarize its surface. One result of reflowing the glass layer is that it will tend to become thicker where it was thinnest, resulting in a layer that is thicker, overall, than as-deposited.

According to the present invention, the glass passivation layer 22 is subjected to chemi-mechanical polishing, which will smooth, thin and planarize the layer 22. As disclosed in the aforementioned U.S. patent application Ser. No. 07/711,624, a quantifiable insight into the mechanics of the polishing process will provide an understanding of just how much glass should be deposited, depending on the underlying topography, to achieve a planar glass surface of a desired thickness. The sizes and range of sizes of the troughs and depressions in the pre-planarized glass layer are also accounted for.

Chemi-mechanical polishing techniques involve the use of an abrasive, chemically reactive slurry, and are becoming known for various purposes, such as planarizing oxide. The present invention advantageously employs chemi-mechanical polishing techniques to provide a significant, non-intuitive result when applied to glass passivation layers.

A suitable slurry for chemi-mechanical polishing the glass layer is type "SC-1" available from Cabot Industries.

Since there is no need for an additional, higher temperature cycle to reflow the glass, additional strain on the thermal budget of an already substantially completed semiconductor device is completely alleviated. Hence, smaller and faster devices can be fabricated.

Another beneficial result of employing polishing rather than reflow is that the thickness of the resulting glass layer can be controlled, and will (overall) be thinner than as-deposited (since a slight amount of material is removed). As a general proposition, a thinner glass layer is more desirable. In any case, maintaining control over the thickness of the glass layer is better than lacking such control.

The invention is applicable to one or more glass layers, although only one glass layer has been shown and illustrated. Evidently, by avoiding reflowing each of multiple glass layers, a compounded benefit will accrue.

What is claimed is:

1. A method of applying a glass passivation layer over a silicon wafer containing underlying substantially defined semiconductor devices comprising:

depositing a passivation layer of glass over a silicon wafer containing underlying substantially defined semiconductor devices at a temperature of about 700°-800° C.;

densifying the glass layer at a temperature of approximately 800° C.; and polishing the glass layer;

thereby forming a substantially planar glass passivation layer without reflowing the glass layer.

2. A method according to claim 1, wherein:

the glass passivation layer is deposited and densified with a total temperature cycle limited to temperatures required to deposit and densify the glass.

3. A method according to claim 1, wherein:

the glass passivation layer is polished by chemimechanical polishing.

4. A method according to claim 1, wherein:

one or more "subsequent" glass passivation layers are applied over the passivation layer; and the steps of depositing, densifying and polishing are repeated for each of the "subsequent" glass passivation layers.

5. A method of applying a glass passivation layer over a silicon wafer containing underlying substantially defined semiconductor devices consisting essentially of:

depositing a passivation layer of glass over a silicon wafer containing underlying substantially defined semiconductor devices at a temperature of about 700°-800° C.;

densifying the glass layer at a temperature of approximately 800° C.; and polishing the glass layer;

thereby forming a substantially planar glass passivation layer without reflowing the glass layer.

* * * * *